United States Patent
Kim et al.

(10) Patent No.: US 11,145,601 B2
(45) Date of Patent: Oct. 12, 2021

(54) SEMICONDUCTOR CHIP INCLUDING ALIGNMENT PATTERN

(71) Applicant: SAMSUNG ELECTRONICS CO., LTD., Suwon-si (KR)

(72) Inventors: Yoon Sung Kim, Hwaseong-si (KR); Yun Hee Kim, Hwaseong-si (KR); Byung Moon Bae, Hwaseong-si (KR); Hyun Su Sim, Hwaseong-si (KR); Jun Ho Yoon, Hwaseong-si (KR); Jung Ho Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 277 days.

(21) Appl. No.: 16/430,630

(22) Filed: Jun. 4, 2019

(65) Prior Publication Data

US 2020/0126927 A1    Apr. 23, 2020

(30) Foreign Application Priority Data

Oct. 23, 2018 (KR) .................. 10-2018-0126940

(51) Int. Cl.
*H01L 23/544* (2006.01)
*H01L 23/31* (2006.01)
*H01L 23/29* (2006.01)

(52) U.S. Cl.
CPC .......... *H01L 23/544* (2013.01); *H01L 23/291* (2013.01); *H01L 23/3171* (2013.01); *H01L 23/3192* (2013.01); *H01L 2223/5446* (2013.01); *H01L 2223/54426* (2013.01)

(58) Field of Classification Search
CPC . H01L 23/291; H01L 23/317; H01L 23/3171; H01L 23/319; H01L 23/3192; H01L 23/544; H01L 2223/544; H01L 2223/5446
See application file for complete search history.

(56) References Cited

U.S. PATENT DOCUMENTS

| | | | |
|---|---|---|---|
| 7,436,047 B2 | 10/2008 | Yang | |
| 7,459,768 B2 | 12/2008 | Ando | |
| 2005/0202650 A1 | 9/2005 | Imori et al. | |
| 2008/0036042 A1* | 2/2008 | Sano | H01L 23/585 257/620 |
| 2016/0148842 A1 | 5/2016 | Ho et al. | |
| 2017/0141130 A1* | 5/2017 | Yamazaki | H01L 23/53295 |

FOREIGN PATENT DOCUMENTS

| | | |
|---|---|---|
| JP | 09260309 | 10/1997 |
| JP | 2002313692 A | 10/2002 |
| KR | 0419054 | 2/2004 |

* cited by examiner

*Primary Examiner* — Cuong Q Nguyen
(74) *Attorney, Agent, or Firm* — Volentine, Whitt & Francos, PLLC

(57) ABSTRACT

A semiconductor chip including an alignment pattern is provided. The semiconductor chip includes a substrate associated with a main chip region of a semiconductor wafer and including a scribe lane. A lower interlayer insulating layer is disposed on the substrate, a low-K layer including dummy metal patterns is disposed on the lower interlayer insulating layer, an alignment pattern is disposed on the low-K layer, and a passivation layer covers the alignment pattern.

20 Claims, 10 Drawing Sheets

US 11,145,601 B2

SEMICONDUCTOR CHIP INCLUDING ALIGNMENT PATTERN

CROSS-REFERENCE TO RELATED APPLICATION

This patent application claims priority to Korean Patent Application No. 10-2018-0126940 filed on Oct. 23, 2018 in the Korean Intellectual Property Office (KIPO), the subject matter of which is hereby incorporated by reference in its entirety.

BACKGROUND

1. Field

Devices consistent with exemplary embodiments relate to a semiconductor chip (hereafter, "chip") singulated from a semiconductor wafer and including alignment patterns. Methods consistent with exemplary embodiments relate to the singulation of a chip from a semiconductor wafer.

2. Description of Related Art

Many contemporary semiconductor devices include a plurality of patterns which are vertically stacked on, and electrically connect to one another. Such stacked patterns must be accurately aligned during the stacking process(es). Accordingly, an alignment key pattern, or an alignment mark may be provided as a reference to properly align the stacked patterns. An alignment key pattern may be formed in a scribe lane disposed between chip regions in which circuit patterns are mainly disposed in a wafer. The alignment key pattern may be formed during the formation of the circuit patterns in respective main chip regions of a semiconductor wafer.

Main chip regions of the semiconductor wafer may be separated from one another using a separation process (e.g., a sawing, dicing and/or etching process) that divides adjacent main chip regions along the scribe lane. A peeling phenomenon may occur due to the alignment key pattern disposed in the scribe lane during the separation process. As a result, the quality of products may be degraded.

SUMMARY

Embodiments of the inventive concept are directed to semiconductor chips respectively associated with main chip regions and including a scribe lane structure capable of preventing the peeling or non-separation of an oxide layer during the separation process.

In one embodiment, a semiconductor chip includes: a substrate associated with a main chip region of a semiconductor wafer and including a scribe lane, a lower interlayer insulating layer disposed on the substrate, a low-K layer including dummy metal patterns disposed on the lower interlayer insulating layer, an alignment pattern disposed on the low-K layer, and a passivation layer at least partially covering the alignment pattern.

In another embodiment, a semiconductor chip includes: a substrate associated with a main chip region of a semiconductor wafer and including a scribe lane surrounding the main chip region, a lower interlayer insulating layer disposed on the substrate, an alignment key structure including a low-K layer disposed on the lower interlayer insulating layer in the scribe lane, an upper alignment pattern disposed on the low-K layer, and a passivation layer disposed on the upper alignment pattern, and dummy pattern structures including a low-K pattern disposed on the lower interlayer insulating layer and a lower dummy pattern disposed in the low-K pattern and disposed on at least one side surface of the alignment key structure.

In another embodiment, a semiconductor chip includes: a substrate associated with a main chip region of a semiconductor wafer and including a scribe lane, a low-K layer configured to extend on the substrate along the scribe lane, a lower dummy pattern disposed in the low-K layer, a passivation layer disposed on the low-K layer, an alignment pattern disposed in the passivation layer, and an open region in which the low-K layer and the passivation layer are partially removed, wherein the lower dummy pattern and the alignment pattern are spaced apart from one another in a lengthwise direction of the scribe lane.

DETAILED DESCRIPTION

In the descriptions that follows, like reference numbers associated with the drawings denote like or similar elements.

Figure (FIG.) 1 is a perspective view illustrating a semiconductor wafer 100 according to an embodiment of the inventive concept.

Figure 1:
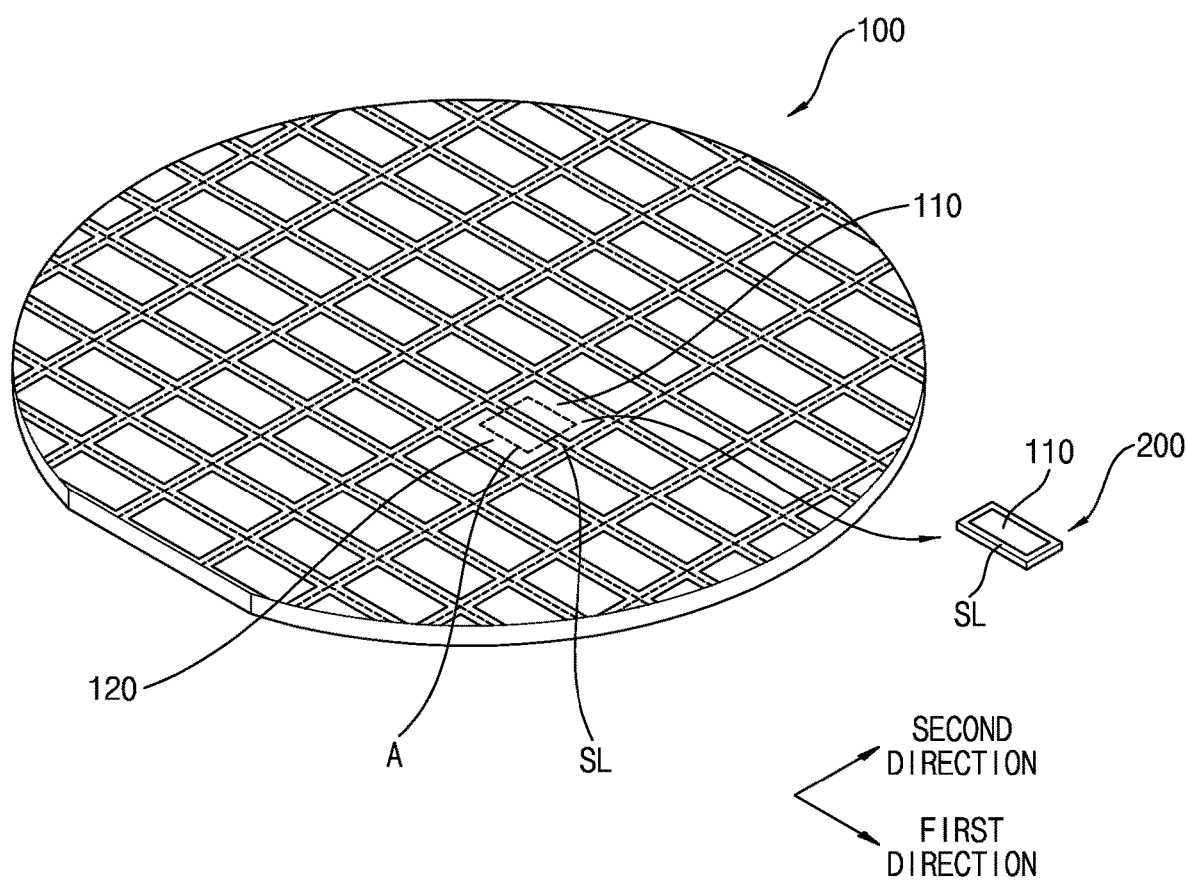
FIG. 1 is a perspective view illustrating a semiconductor wafer according to an embodiment of the inventive concept.

Referring to FIG. 1, the semiconductor wafer 100 may include a number of main chip regions (e.g., a matrix arrangement of main chip regions extending over a primary surface of the semiconductor wafer 100 in first and second directions). Each main chip region may include one or more semiconductor element(s), component(s), circuit(s) and/or related connection(s) sufficient to provided intended functionality or purpose. Hereafter, for the sake of brevity, any reasonable combination of semiconductor element(s), component(s), circuit(s) and/or related connection(s) will be termed a "circuit pattern".

The plurality of main chip regions shown in FIG. 1 include a first main chip region 110 and an adjacent second main chip region 120. Hereafter, it is assumed that the first and second main chip regions 110 and 120 respectively include a completed circuit pattern. All of the main chip regions fabricated on the semiconductor wafer 100, including the first and second main chip regions 110 and 120, may be substantially similar. That is, each main chip region may include a substantially similar circuit pattern, such as a dynamic random access memory (DRAM) or a phase-change RAM (PRAM).

Respective main chip regions may be fabricated on the semiconductor wafer 100 with any reasonable size and shape. For example, the first and second main chip regions 110 and 120 of FIG. 1 are assumed to each have a tetragon shape and a substantially similar size, but this need not be the case in other embodiments.

As further illustrated in FIG. 1, each of the main chip regions, such as the first main chip region 110, may be geometrically defined in its intended shape, size and proximity to adjacent main chip regions using one or more scribe lane(s) SL. Recognizing that various scribe lane(s) of varying complexity and/or geometric relationship may be used to define a main chip region, the one or more scribe lane(s) illustrated in the following example embodiments will be referred to simply as a "scribe lane".

In FIG. 1, the scribe lane SL may be understood as "separating" (e.g., being disposed between) the first and second main chip regions 110 and 120. Alternatively or additionally, the scribe lane SL of FIG. 1 may be understood as "surrounding" the first and second main chip region 110 and 120, individually or collectively. Hence, the first and second main chip regions 110 and 120 may be said to be "spaced apart" from one another by the scribe lane SL.

The scribe lane SL may be variously defined in its geometry (e.g., width and length) according to one or more purpose(s). For example, the scribe lane SL may be used to define a "separation space" in which, or according to which, adjacent main chip regions may be physically separated into corresponding semiconductor chips 200. Alternately or additionally, the scribe lane SL may include a process pattern or test pattern.

Again referring to FIG. 1, the main chip regions of the semiconductor wafer 100 may be separated into a corresponding semiconductor chips 200 using one or more processes, including for example, physical singulation, mechanical sawing, laser dicing, plasma etching etc. Hereafter, the term "separation process" will be used to denote one or more process(es) and techniques, regardless of their particular nature, that may be used to separate a main chip region from the semiconductor wafer 100 to yield a semiconductor chip 200. Since various types and combinations of material layer(s) may be used to fabricate the semiconductor wafer 100, the separation process may vary accordingly.

In this regard and assuming the use of a mechanical or laser saw in relation to the separation process, the scribe lane SL may include a dicing lane or a cut scribe lane (see, e.g., the dashed line of FIG. 1). Accordingly in certain embodiments, the scribe lane SL may be disposed on or around edge(s) of the semiconductor chip 200. The scribe lane SL may define the location of sidewall(s) of the resulting semiconductor chip 200.

Figure 2:
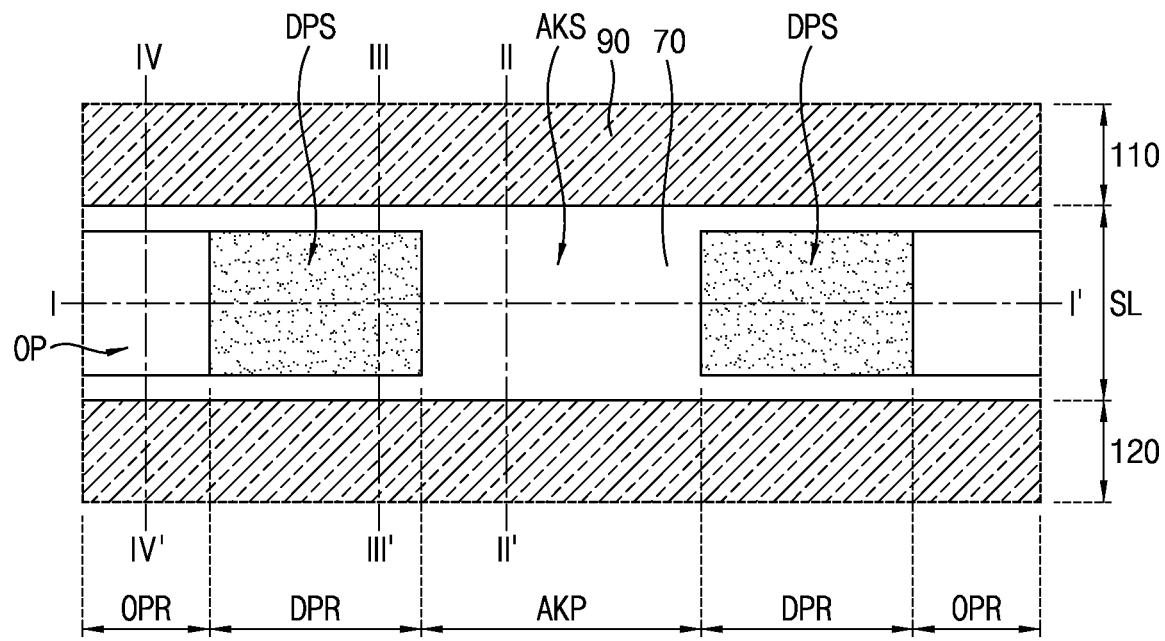
FIG. 2 is an enlarged view of the region A shown in FIG. 1.
Figure 3:
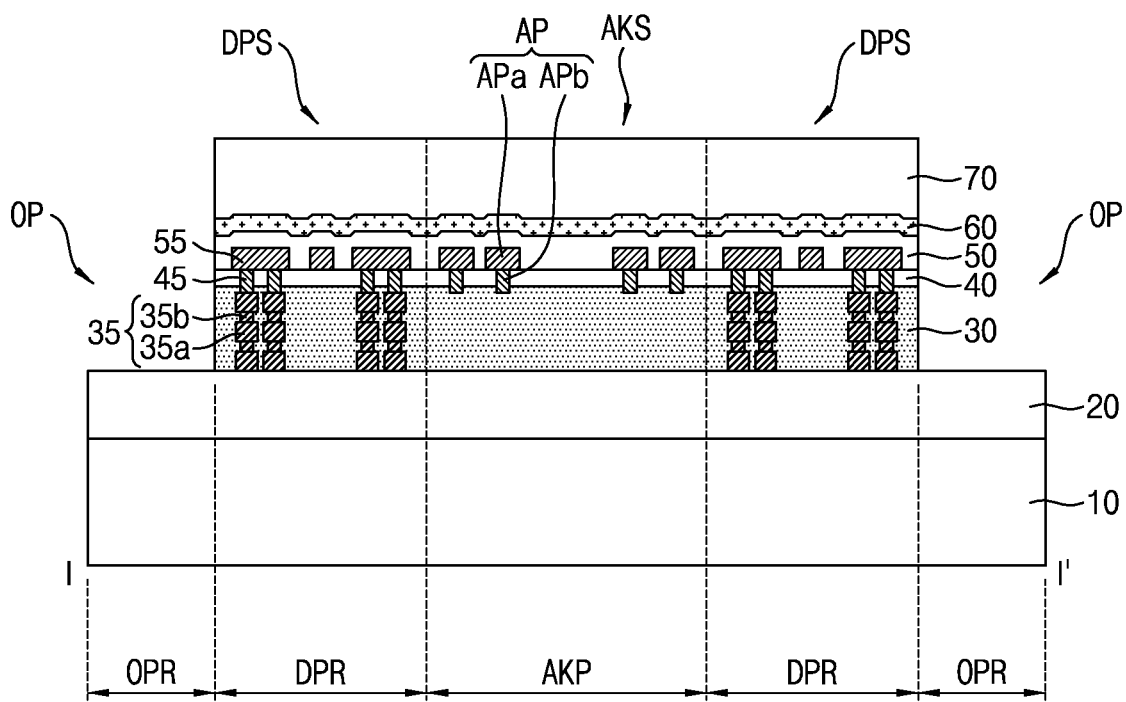
FIG. 3 is a vertical cross-sectional view taken along line I-I' of FIG. 2.
Figure 4:
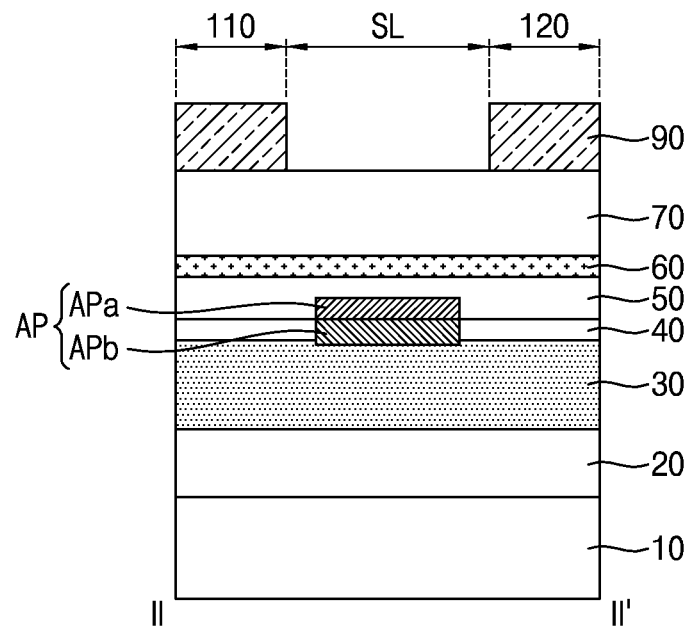
FIG. 4 is a vertical cross-sectional view taken along line II-II' of FIG. 2.
Figure 5:
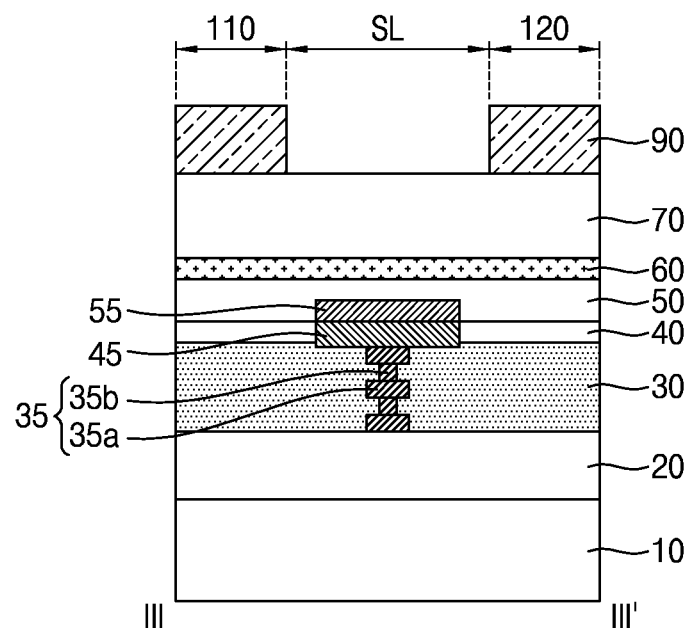
FIG. 5 is a vertical cross-sectional view taken along line III-III' of FIG. 2.
Figure 6:
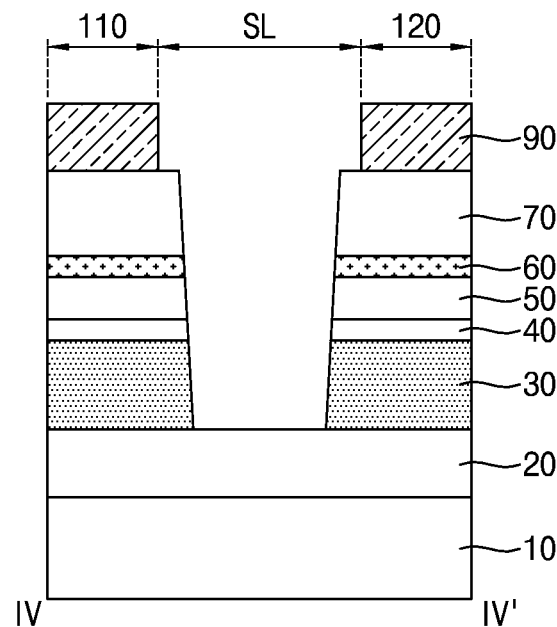
FIG. 6 is a vertical cross-sectional view taken along line IV-IV' of FIG. 2.

FIG. 2 is an enlarged plan view of the region 'A' identified in FIG. 1; FIG. 3 is a vertical cross-sectional view taken along line I-I' of FIG. 2; FIG. 4 is a vertical cross-sectional view taken along line II-II' of FIG. 2; FIG. 5 is a vertical cross-sectional view taken along line III-III' of FIG. 2; and FIG. 6 is a vertical cross-sectional view taken along line IV-IV' of FIG. 2.

Referring collectively to FIGS. 2, 3, 4, 5, and 6, region A of the semiconductor wafer 100 further illustrates the scribe lane SL disposed between the first and second main chip regions 110 and 120. Here, a width of the scribe lane SL may be defined by a wrapping layer 90 disposed on the respective edges of the first and second main chip regions 110 and 120. The wrapping layer 90 may be disposed on respective top, outer-edge surface portions of the first and second main chip regions 110 and 120. Thus, the wrapping layer 90 may be used to cover and protect portions of respective circuit pattern(s) located proximate to the respective outer edges of the first and second main chip regions 110 and 120. In this manner, the wrapping layer 90 may also stably insulate (post-singulation) the resulting semiconductor chips 200, thereby protecting the semiconductor chips 200 from physical, chemical, and/or electrical damage.

In certain embodiments, the wrapping layer 90 may include a photo-sensitive polyimide (PSPI).

Singulated portions of the semiconductor wafer 100 may form (or serve as) a substrate 10 in relation to a particular semiconductor chip 200. That is, a substrate "associated with a main chip region" of the semiconductor wafer 100 may be understood as an integral part of a corresponding semiconductor chip 200. Hence, a portion of the substrate 10 associated with (or including) a scribe lanes SL may include an alignment key region AKP, a dummy pad region DPR, and/or an open region OPR.

For example, a lower interlayer insulating layer 20 may be disposed on the substrate 10. The lower interlayer insulating layer 20 may include an oxide (e.g., tetraethyl orthosilicate (TEOS)) or a high-density plasma (HDP). Although not illustrated in the embodiments, transistors may be formed on the substrate 10, and the lower interlayer insulating layer 20 may include lower interconnection layers electrically connected to the transistors.

The alignment key region AKP may be disposed between the dummy pad regions DPR in the first direction (e.g., a lengthwise direction) of the scribe lane SL. The alignment key region AKP may be disposed between the wrapping layers 90 in the second direction substantially perpendicular to the first direction.

In this regard, although FIG. 3 illustrates a case in which a boundary of the alignment key region AKP is spaced apart from one side surface of an alignment pattern AP, a boundary of the alignment key region AKP may alternatively be aligned with an outer sidewall of the alignment pattern AP. An alignment key structure AKS may be disposed in the alignment key region AKP. The alignment key structure AKS may completely cover the alignment key region AKP within a scribe lane defined in relation to the scribe lane SL. When viewed from above, an upper end and a lower end of one side surface of the alignment key structure AKS may elongate in the first direction and extend to the dummy pad region DPR and the open region OPR. Further, an upper end and a lower end of another side surface of the alignment key structure AKS may elongate in a direction opposite to the first direction and extend to the dummy pad region DPR and the open region OPR.

In certain embodiments, the alignment key structure AKS may include a low-K layer 30, an upper interlayer insulating layer 40, a passivation layer 50, 60, and 70, and an alignment pattern AP. The passivation layer 50, 60, and 70 may include a first insulating layer 50, a second insulating layer 60, and a third insulating layer 70.

The low-K layer 30 may include at least one low-K material. The low-K layer 30 may have a lower dielectric constant with respect to silicon oxide (e.g., low-K layer 30 may have a dielectric constant less than 3.9). For example, the low-K layer 30 may include a silicon oxide-based material doped with impurities, porous silicon oxide, or an organic polymer. For example, a silicon oxide-based material doped with impurities may include a fluorine-doped silicon oxide film (or fluorosilicate glass (FSG)), a carbon-doped silicon oxide film, a silicon oxide film, hydrogen silsesquioxane (HSQ; SiO:H), methyl silsesquioxane (MSQ; SiO:CH$_3$), or amorphous silicon oxycarbide (a-SiOC) (or SiOC:H). The organic polymer may include polyallylether-based resin, annular fluorine resin, siloxane copolymer, a polyallylether fluoride-based resin, poly(pentafluorostyrene), a polytetrafluorostyrene-based resin, polyimide fluoride resin, polynaphthalene fluoride, or polycide resin.

The upper interlayer insulating layer 40, the first insulating layer 50, and the third insulating layer 70 may include oxide or HDP, and the second insulating layer 60 may include nitride. For example, the upper interlayer insulating layer 40 and the third insulating layer 70 may include TEOS, the first insulating layer 50 may include HDP, and the second insulating layer 60 may include silicon nitride (SiN). However, various material(s) may alternatively or additionally be used.

In certain embodiments, the alignment pattern AP may include an upper alignment pattern APa and a lower alignment pattern APb. The upper alignment pattern APa may be disposed on the upper interlayer insulating layer 40. For example, the upper alignment pattern APa may include a plurality of bar-shaped metal patterns disposed parallel to each other. However, a shape of the upper alignment pattern APa may vary with design and may variously include discriminable pattern shapes. The upper alignment pattern APa may include one or more conductive material(s) such as copper (Cu), aluminum (Al), tungsten (W), titanium (Ti), and/or a combination thereof.

The lower alignment pattern APb may variously extend through the upper interlayer insulating layer 40. When viewed from above, the upper alignment pattern APa may overlap at least a portion of the lower alignment pattern APb, such that an upper end of the lower alignment pattern APb may contact a lower end of the upper alignment pattern APa. The lower alignment pattern APb and the upper alignment pattern Apa may be formed of the same or different material(s).

The dummy pad region DPR may be disposed on each side of the alignment key region AKP, wherein a dummy pattern structure DPS may be disposed in the dummy pad region DPR. The dummy pattern structure DPS may be provided in contact with a side surface of the alignment key structure AKS. The dummy pattern structure DPS may include, for example, the low-K layer 30, upper interlayer insulating layer 40, passivation layer 50, 60, and 70, and a dummy pattern 35, 45, and 55.

In certain embodiments, the dummy pattern 35, 45, and 55 may include a lower dummy pattern 35 and upper dummy pattern(s) 45 and 55. The lower dummy pattern 35 may be disposed in the low-K layer 30, and may include a first lower dummy pattern 35a and a second lower dummy pattern 35b in certain embodiments. The first lower dummy pattern 35a and the second lower dummy pattern 35b may have different or the same widths. The first lower dummy pattern 35a and the second lower dummy pattern 35b may be alternately and repeatedly stacked. An upper end of an uppermost one of the first lower dummy patterns 35a and the second lower dummy patterns 35b may be at substantially the same level as an upper end of the low-K layer 30. Here again, the first lower dummy pattern 35a and/or the second lower dummy pattern 35b may include at least one conductive material such as copper, aluminum, tungsten, titanium, and/or a combination thereof. The first lower dummy pattern 35a and the second lower dummy pattern 35b may be formed of the same or different material(s).

The upper dummy pattern 45 and 55 may be disposed on the low-K layer 30. The upper dummy pattern 45 and 55 may be disposed in a position corresponding to the lower dummy pattern 35 in a sectional view thereof. The upper dummy pattern 45 and 55 may include at least one conductive material such as copper, aluminum, tungsten, titanium, and/or a combination thereof. The upper dummy pattern 45 and 55 and the lower dummy pattern 35 may be formed of the same or different material(s).

The upper dummy pattern 45 and 55 may include a first upper dummy pattern 45 and a second upper dummy pattern 55. The first upper dummy pattern 45 may extend through the upper interlayer insulating layer 40, such that a lower end of the first upper dummy pattern 45 is in contact with an upper end of the lower dummy pattern 35. The second upper dummy pattern 55 disposed on the upper interlayer insulating layer 40 may be disposed on the first upper dummy pattern 45. A lower end of the second upper dummy pattern 55 may be disposed in contact with the upper end of the first upper dummy pattern 45. The first upper dummy pattern 45 and the second upper dummy pattern 55 may be formed of the same or different material(s).

For semiconductor chips including a structure like the lower dummy pattern 35 disposed in the low-K layer 30, a vertical progression of material cracking associated with the substrate 10 may be facilitated during the performing of a separation process used to divide respective semiconductor chips 200 from the semiconductor wafer 100. Thus, when the dummy pattern structures DPS including the lower dummy patterns 35 are disposed on both sides of the alignment key structure AKS, adjacent semiconductor chips 200 may be clearly separated without causing the peeling of the alignment key structure AKS.

In one embodiment, a shortest distance between one sidewall of the lower dummy pattern 35 and a sidewall of the alignment key structure AKS in the first direction may be 8 µm or less (i.e., not greater than 8 µm). For example, when viewed from above, the distance between one sidewall of the second lower dummy pattern 35b disposed closest to the alignment key region AKP and a sidewall of the upper alignment pattern APa may be not greater than 8 µm. However, when the distance between the lower dummy pattern 35 and the alignment key structure AKS exceeds 8 µm, a vertical progression of cracking due to the dummy pattern may not adversely affect the alignment key structure AKS during the performing of the separating process to yield respective semiconductor chip(s) 200 from the semiconductor wafer 100.

Figure 7:
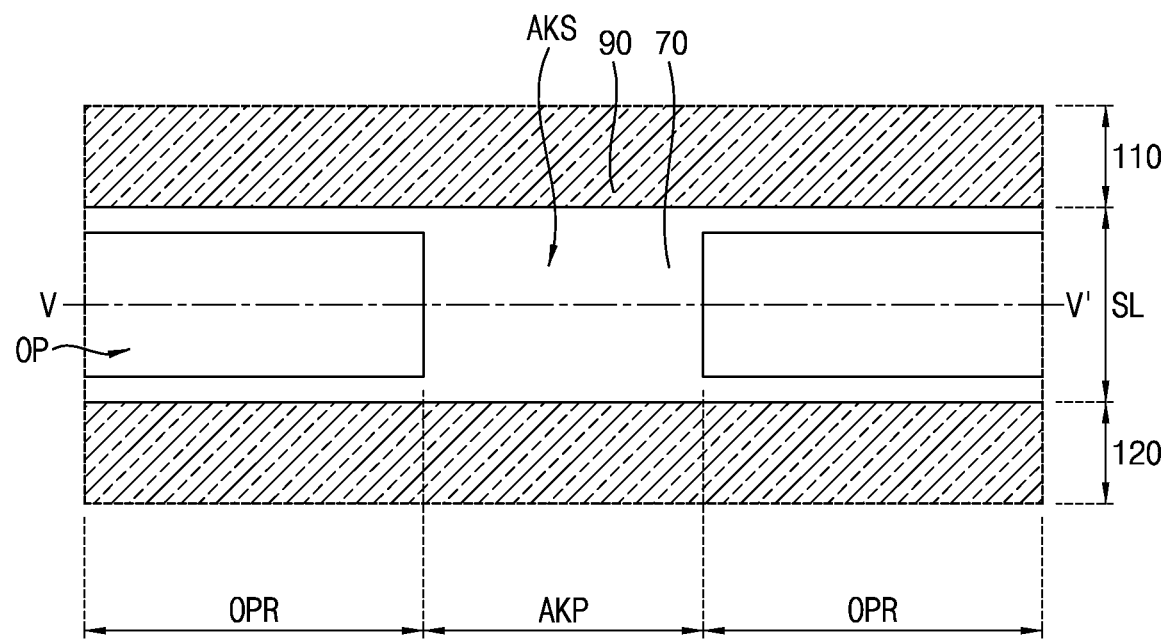
FIG. 7 is another enlarged view of the region A of FIG. 1.
Figure 8:
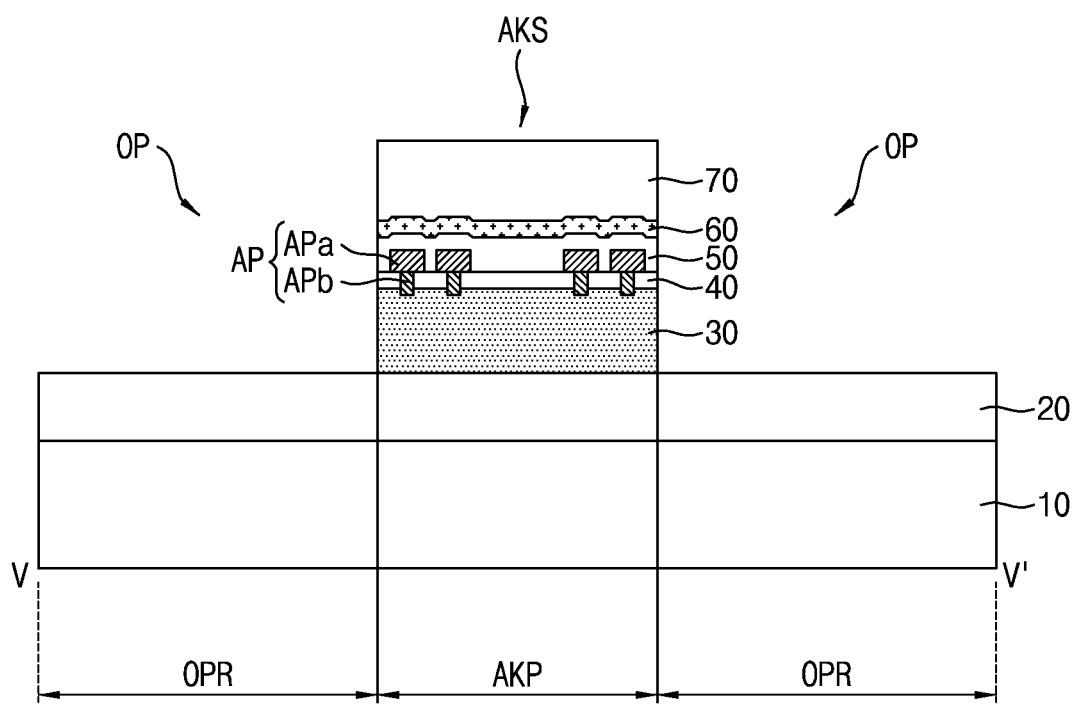
FIG. 8 is a vertical cross-sectional view taken along line V-V' of FIG. 7.

FIG. 7 is another enlarged view of the region A of FIG. 1 and may be compared with FIG. 2, and FIG. 8 is a vertical cross-sectional view taken along line V-V' of FIG. 7.

Referring to FIGS. 7 and 8 and comparing FIGS. 2 and 3, it should be noted that the dummy pattern structures DPS are absent from the sides of the alignment key structure AKS in FIGS. 7 and 8. Hence, material cracking associated with the substrate 10 is significantly less likely to occur in a vertical direction, but may occur in a lateral direction during certain separation process(es) (e.g., back-grinding of the semiconductor wafer 100). As a result, insulating layers included in the alignment key structure AKS may not be clearly divided along scribe lanes (e.g., sawing lanes), but instead, may be torn due to a peeling phenomenon.

Referring now to FIGS. 2, 3, and 6, the open regions OPR may be disposed adjacent to dummy pad regions DPR. The open region OPR may expose a sidewall of the dummy pattern structure DPS and a top surface of the lower interlayer insulating layer 20. Further, the open region OPR may also expose a sidewall of the alignment key structure AKS, which may elongate in the first direction.

Figure 9:
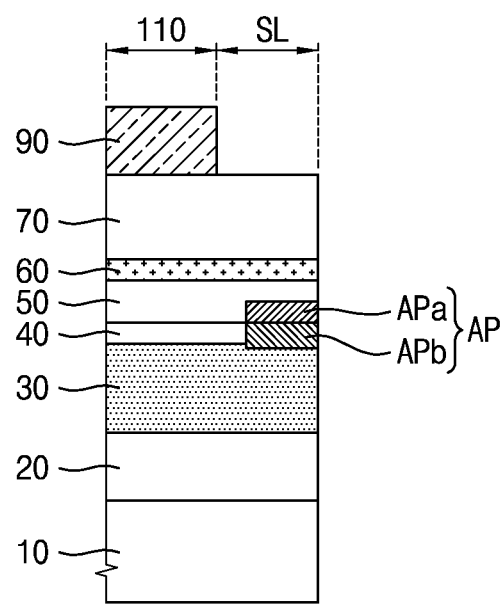
FIG. 9 is a vertical cross-sectional view taken along line II-II' of a separated semiconductor chip when a semiconductor wafer of FIG. 2 is separated along line I-I'.

FIG. 9 is a vertical cross-sectional view taken along line II-II' of a separated semiconductor chip when the semiconductor wafer 100 of FIGS. 1 and 2 is separated along line I-I'. Similarly, FIG. 10 is a vertical cross-sectional view taken along line III-III', and FIG. 11 is a vertical cross-sectional view taken along line IV-IV'.

Referring to FIGS. 1, 2 and 3, a semiconductor chip 200 singulated from the semiconductor wafer 100 may have a 4-sided, tetragonal shape and will therefore have four exposed side surfaces. In certain embodiments, at least one of four exposed side surfaces of the singulated semiconductor chip 200 may include the same components as shown in FIG. 3. For example, when a separation process is performed on the semiconductor wafer 100 along line I-I' (i.e., along the scribe lane SL shown in FIG. 2), one side surface of the singulated semiconductor chip 200 may correspond to the cross-section shown in FIG. 3.

Referring to FIGS. 1, 2, and 9, a side surface of an alignment pattern AP may be exposed by at least a partial side surface of the semiconductor chip 200. For example, a side surface of at least one of an upper alignment pattern APa and a lower alignment pattern APb of the alignment pattern AP may be exposed by one side surface of the semiconductor chip 200.

Figure 10:
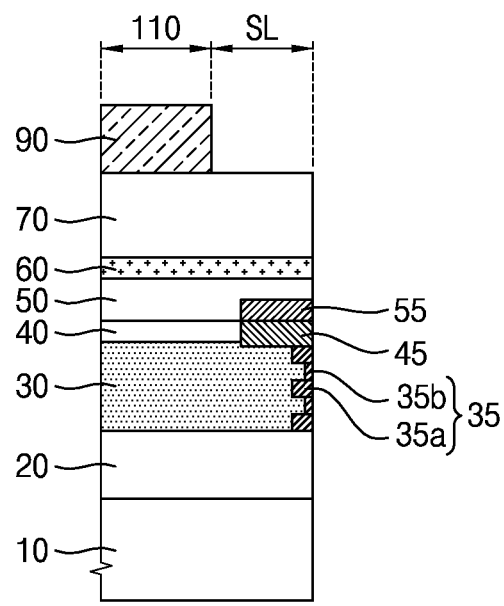
FIG. 10 is a vertical cross-sectional view taken along line III-III' of a separated semiconductor chip when the semiconductor wafer of FIG. 2 is separated along line I-I'.
Figure 11:
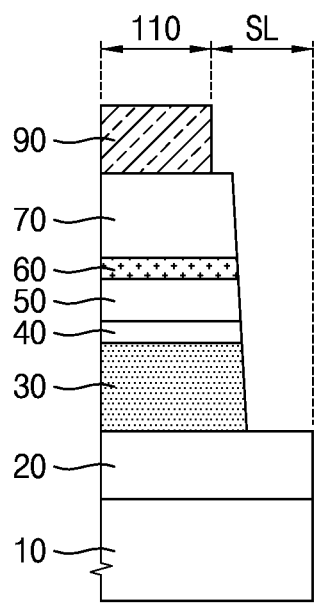
FIG. 11 is a vertical cross-sectional view taken along line IV-IV' of the separated semiconductor chip when a semiconductor wafer of FIG. 2 is separated along line I-I'.

Referring to FIGS. 1, 2, and 10, a side surface of at least one of a lower dummy pattern 35 and an upper dummy pattern 45 and 55 may be exposed by at least one side surface of the semiconductor chip 200. For example, a side surface of at least one of a first lower dummy pattern 35a and a second lower dummy pattern 35b of the lower dummy pattern 35 may be exposed by one side surface of the semiconductor chip 200. A side surface of at least one of a first upper dummy pattern 45 and a second upper dummy pattern 55 of the upper dummy pattern 45 and 55 may be exposed by one side surface of the semiconductor chip 200.

Referring to FIGS. 1, 2, and 11, a step structure may be formed on one side surface of the semiconductor chip 200 to expose a top surface of a lower interlayer insulating layer 20.

Figure 12:
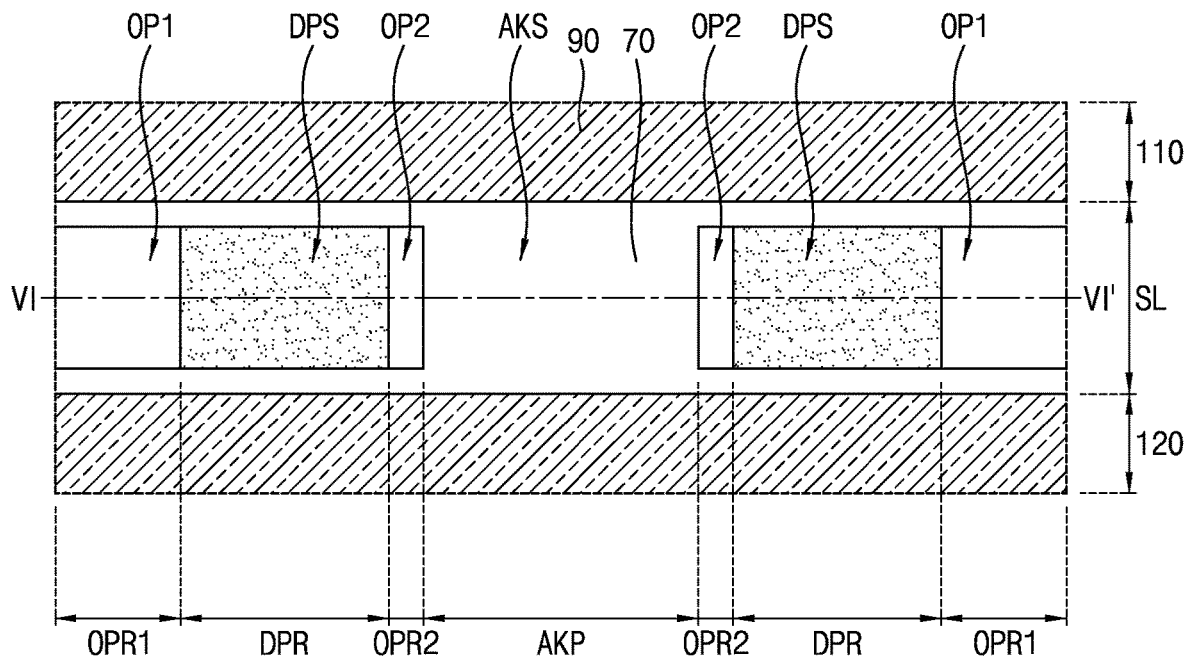
FIG. 12 is another enlarged view of region A of FIG. 1 according to an embodiment.
Figure 13:
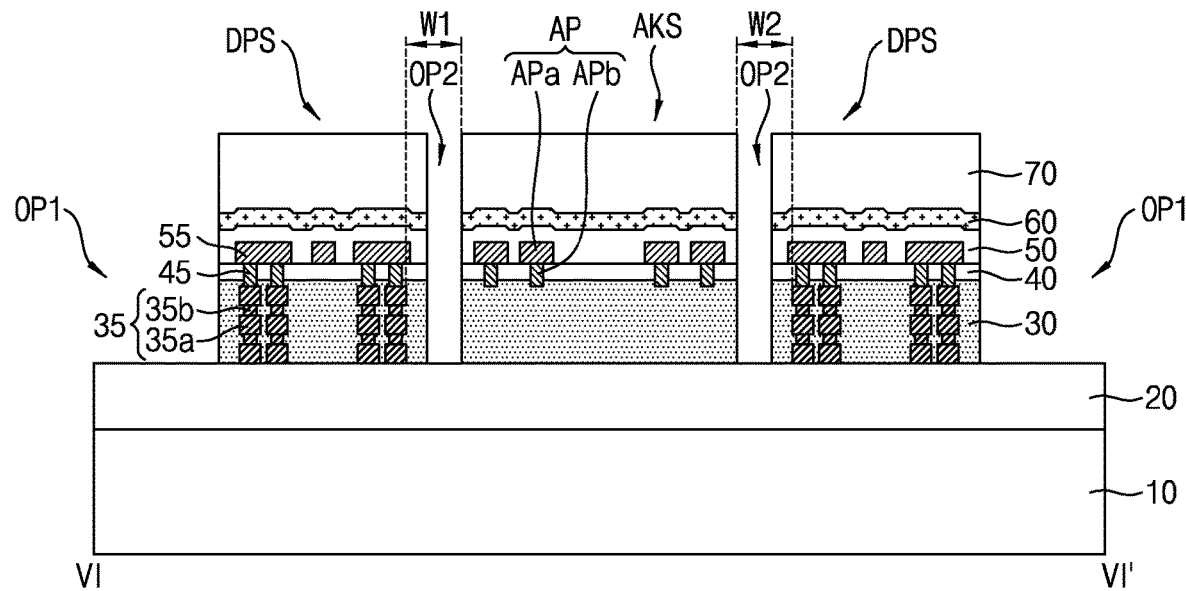
FIG. 13 is a vertical cross-sectional view taken along line VI-VI' of FIG. 12.

FIG. 12 is another enlarged view of the region A of FIG. 1, and FIG. 13 is a vertical cross-sectional view taken along line VI-VI' of FIG. 12.

Referring to FIGS. 12 and 13, dummy pattern structures DPS may be disposed respectively on both sides of an alignment key structure AKS. Referring to FIG. 13, an alignment pattern AP may be completely covered by the first insulating layer 50, but the inventive concept is not limited thereto, and a sidewall of the alignment pattern AP may be exposed. The dummy pattern structure DPS may be disposed to be spaced apart from the alignment key structure AKS. A first open portion OP1 may be disposed on one side of the dummy pattern structure DPS, and a second open portion OP2 may be disposed on another side of the dummy pattern structure DPS. The second open portion OP2 may be formed between the dummy pattern structure DPS and the alignment key structure AKS. The first and second open portions OP1 and OP2 may expose a top surface of a lower interlayer insulating layer 20 and a sidewall of the dummy pattern structure DPS. When the second open portion OP2 is formed between the dummy pattern structure DPS and the alignment key structure AKS, a distance W1 between one sidewall of a lower dummy pattern 35 and one sidewall of the alignment key structure AKS in the first direction may be not greater than 8 μm. When the distance W1 between the lower dummy pattern 35 and the alignment key structure AKS exceeds 8 μm, vertical progression of cracking due to a dummy pattern need not affect the alignment key structure AKS during the separation process.

FIGS. 14, 15, 16 and 17 are process related, cross-sectional views further describing a method of manufacturing a semiconductor wafer having a cross section like the one shown in of FIG. 3.

Figure 14:
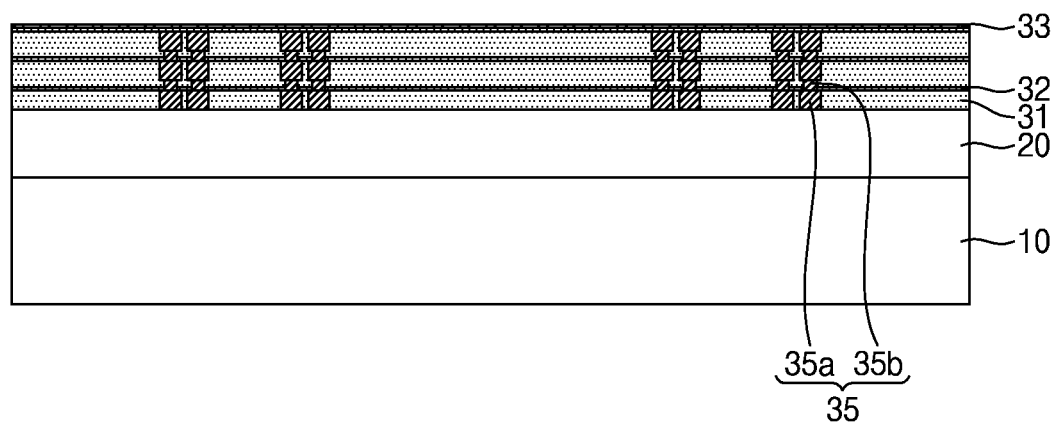
FIGS. 14, 15, 16 and 17 are respective cross-sectional views illustrating a method of manufacturing a semiconductor wafer having a cross-section shown in FIG. 3.

Referring to FIG. 14, a transistor (not shown), a lower interconnection (not shown), and a lower interlayer insulating layer 20 may be formed on a substrate 10. The substrate 10 may be a portion of the semiconductor wafer 100 of FIG. 1. The transistor may include a metal-oxide-semiconductor field-effect transistor (MOSFET). The lower interlayer insulating layer 20 may include silicon oxide.

A low-K layer 31 may be formed on the lower interlayer insulating layer 20. The low-K layer 31 and an inter-metal dielectric layer (IML) 32, which include different material(s), may be alternately and repeatedly stacked. For example, the low-K layer 31 may include a low-K dielectric, an ultralow-K dielectric, silicon nitride (SiN), and/or a combination thereof. The IML 32 may include silicon carbonitride (SiCN). An insulating layer 33, which has a small thickness and includes silicon nitride (SiN), may be disposed on an uppermost one of the IMLs 32. A lower dummy pattern 35 may be formed during the formation of the low-K layer 31 and the IML 32. Although not shown, metal patterns electrically connected to the transistors and the lower interconnection may be formed together in the low-K layer 31.

Figure 15:
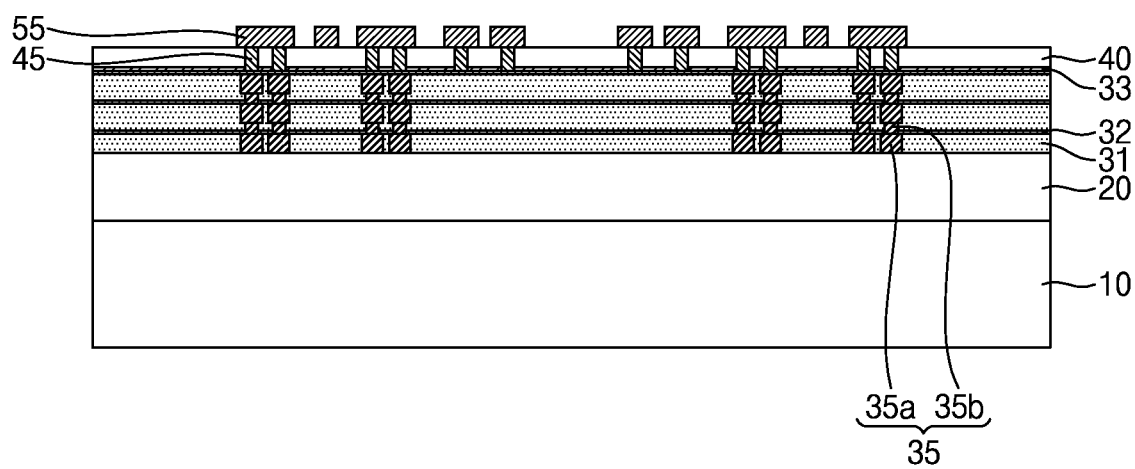

Referring to FIG. 15, an upper interlayer insulating layer 40 may be formed on the insulating layer 33. A first upper dummy pattern 45 may be formed in the upper interlayer insulating layer 40, and a second upper dummy pattern 55 may be formed on the upper interlayer insulating layer 40. A lower end of the first upper dummy pattern 45 may be in contact with the insulating layer 33. Alternatively, the first upper dummy pattern 45 may extend through the insulating layer 33 so that the lower end of the first upper dummy pattern 45 may be in contact with an upper end of the lower dummy pattern 35.

Figure 16:
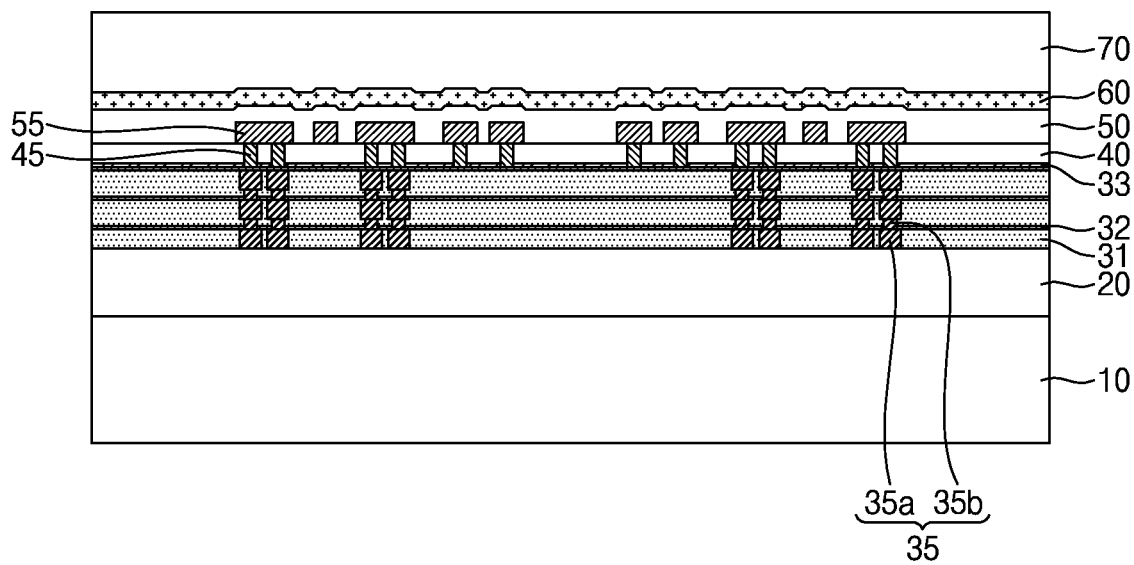

Referring to FIG. 16, a passivation layer 50, 60, and 70 may be formed. The passivation layer 50, 60, and 70 may include first to third insulating layers 50, 60, and 70 sequentially stacked on the upper interlayer insulating layer 40. The first insulating layer 50 may cover the second upper dummy pattern 55 on the upper interlayer insulating layer 40. As an example, the first insulating layer 50 and the third insulating layer 70 may include oxide, and the second insulating layer 60 may include nitride.

Figure 17:
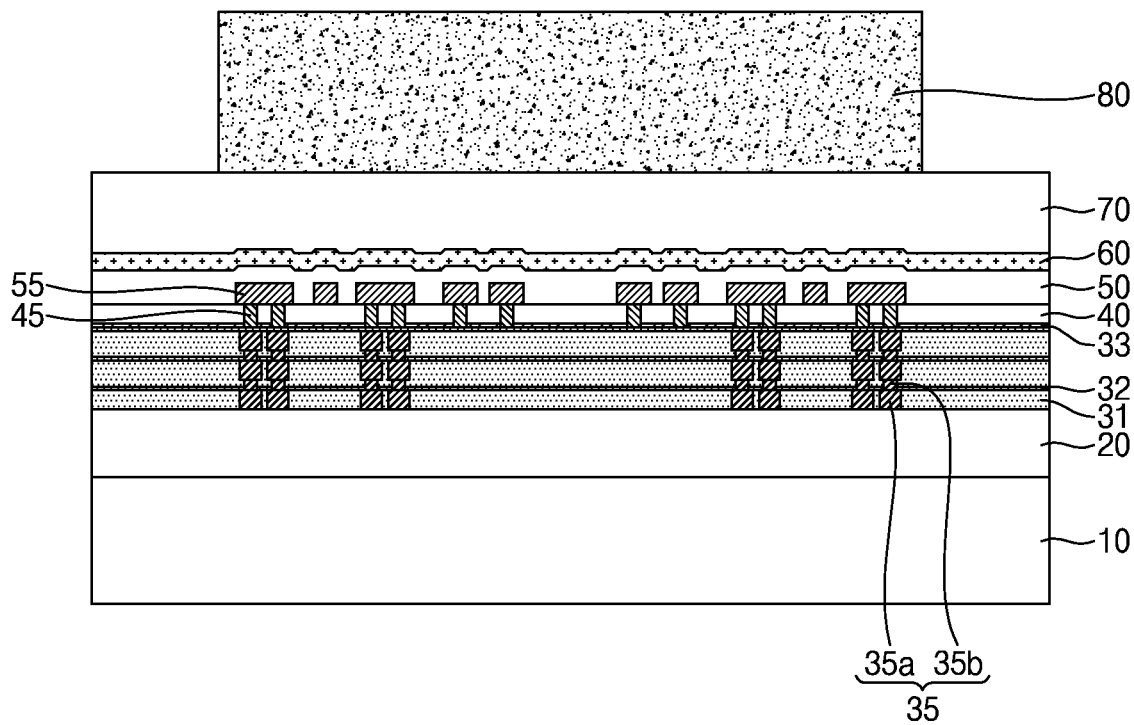

Referring to FIGS. 3 and 17, a mask pattern 80 may be formed on the third insulating layer 70, and the passivation layer 50, 60, and 70, the upper interlayer insulating layer 40, the low-K layer 31, the IML 32, and the insulating layer 33 may be partially removed through an etching process using the mask pattern 80 as an etch mask. The upper interlayer insulating layer 40 and the low-K layer 31 may be etched to form a stack structure. That is, an alignment key structure AKS may be integrally formed with a dummy pattern structure DPS to form the stack structure. Then, the mask pattern 80 may be removed.

Figure 18:
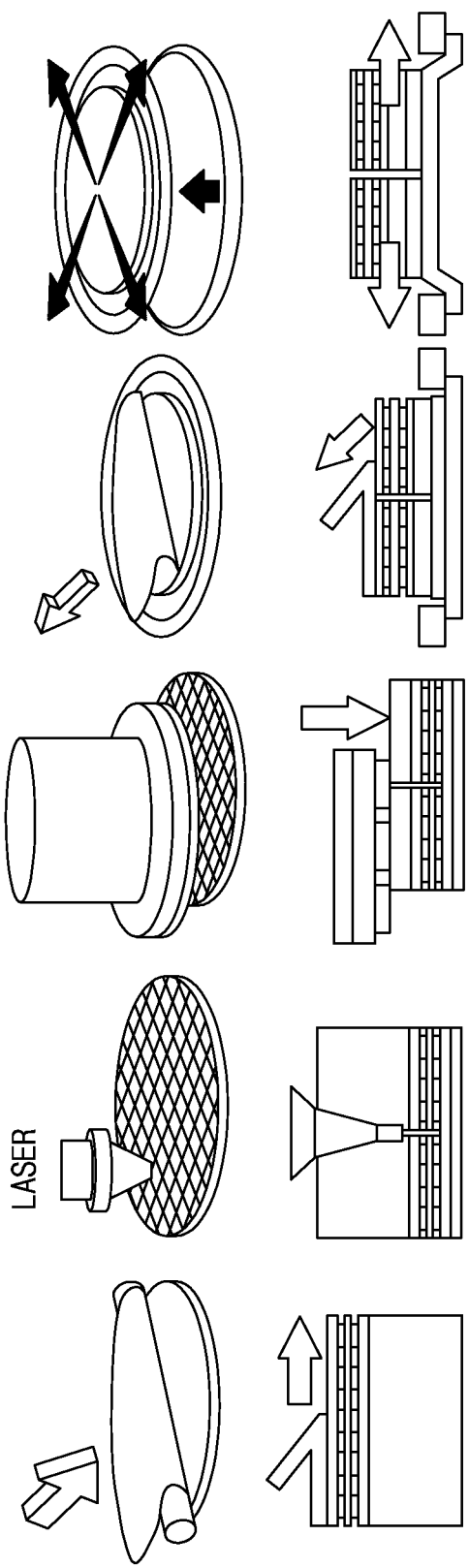
FIG. 18 illustrates part of a separation process for singulating semiconductor chips from a semiconductor wafer in a sequence of conceptual illustrations.

FIG. 18 further describes aspects of the foregoing in a sequence of conceptual illustrations. Referring to FIG. 18, laser beams of defined wavelength having transmittance to a semiconductor wafer may be projected to form cracks in the wafer substrate. Thereafter, during back-grinding of the semiconductor wafer, cracking may vertically progress toward a front surface of the wafer due to the pressure generated during the back grinding process—which may be part of a separation process used to singulate semiconductor chips 200 from the semiconductor wafer 100. In this case, according to embodiments of the inventive concept, dummy patterns may be disposed on both sides of an alignment key structure including a low-K layer. Thus, cracking in the lateral direction due to the low-K layer may be prevented.

According to the certain embodiments of the inventive concept, when a semiconductor wafer including a low-K material is separated along a scribe lane SL using e.g., laser dicing, a peeling phenomenon where an alignment key or an insulating layer covering the alignment key is torn may be prevented, and the resulting semiconductor chips can be cleanly and clearly separated from one another.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A semiconductor chip comprising:
a substrate associated with a main chip region of a semiconductor wafer and including a scribe lane;
a lower interlayer insulating layer disposed on the substrate;
a low-K layer including dummy metal patterns disposed on the lower interlayer insulating layer;
an alignment pattern disposed on the low-K layer; and
a passivation layer at least partially covering the alignment pattern.

2. The semiconductor chip of claim 1, wherein the alignment pattern is disposed between the dummy metal patterns in a lengthwise direction of the scribe lane.

3. The semiconductor chip of claim 2, wherein a shortest distance between the dummy metal patterns and the alignment pattern is not greater than 8 μm.

4. The semiconductor chip of claim 1, wherein the dummy metal patterns include a first lower dummy pattern and a second lower dummy pattern, and
an uppermost end of the dummy metal patterns is at substantially the same level as an uppermost end of the low-K layer.

5. The semiconductor chip of claim 4, further comprising an upper interlayer insulating layer disposed between the low-K layer and the passivation layer,
wherein the dummy metal patterns further include a first upper dummy pattern extending through the upper interlayer insulating layer and in contact with an uppermost end of a lower dummy pattern including the first lower dummy pattern and the second lower dummy pattern.

6. The semiconductor chip of claim 5, wherein the dummy metal patterns further include a second upper dummy pattern disposed on the upper interlayer insulating layer and having a lower end in contact with the first upper dummy pattern.

7. The semiconductor chip of claim 1, wherein the scribe lane comprises an alignment key region in which the alignment pattern is disposed, a dummy pad region in which the dummy metal patterns are disposed, and an open region configured to expose a top surface of the lower interlayer insulating layer and a side surface of the low-K layer.

8. The semiconductor chip of claim 7, wherein the open region comprises a first open region formed on one side of each of the dummy metal patterns and a second open region formed between the dummy metal pattern and the alignment pattern.

9. The semiconductor chip of claim 1, wherein the passivation layer comprises a first insulating layer in contact with the alignment pattern, a second insulating layer disposed on the first insulating layer, and a third insulating layer disposed on the second insulating layer.

10. The semiconductor chip of claim 9, wherein the first insulating layer and the third insulating layer include oxide, and the second insulating layer includes nitride.

11. A semiconductor chip comprising:
a substrate associated with a main chip region of a semiconductor wafer and including a scribe lane surrounding the main chip region;
a lower interlayer insulating layer disposed on the substrate;
an alignment key structure including a low-K layer disposed on the lower interlayer insulating layer in the scribe lane, an upper alignment pattern disposed on the low-K layer, and a passivation layer disposed on the upper alignment pattern; and
dummy pattern structures including a low-K pattern disposed on the lower interlayer insulating layer and a lower dummy pattern disposed in the low-K pattern and disposed on at least one side surface of the alignment key structure.

12. The semiconductor chip of claim 11, wherein one side surface of the alignment key structure and one side surface of the dummy pattern structure face each other in a lengthwise direction of the scribe lane, and contact one another.

13. The semiconductor chip of claim 11, wherein the alignment key structure is spaced apart from the dummy pattern structure in a lengthwise direction of the scribe lane.

14. The semiconductor chip of claim 11, wherein a shortest distance between the lower dummy pattern and the alignment key structure is not greater than 8 μm.

15. The semiconductor chip of claim 11, wherein the dummy pattern structure further comprises an upper interlayer insulating pattern disposed on the low-K pattern and a passivation pattern disposed on the upper interlayer insulating pattern.

16. The semiconductor chip of claim 15, wherein the dummy pattern structure further comprises a first upper dummy pattern extending through the upper interlayer insulating pattern, and a second upper dummy pattern disposed on the first upper dummy pattern, wherein the first upper dummy pattern is in contact with each of the lower dummy pattern and the second upper dummy pattern.

17. The semiconductor chip of claim 11, wherein the alignment key structure further comprises an upper interlayer insulating layer disposed between the low-K layer and the passivation layer, and a lower alignment pattern disposed in the upper interlayer insulating layer, the lower alignment pattern in contact with a lower end of the upper alignment pattern.

18. A semiconductor chip comprising:
- a substrate associated with a main chip region of a semiconductor wafer and including a scribe lane;
- a low-K layer configured to extend on the substrate along the scribe lane;
- a lower dummy pattern disposed in the low-K layer;
- a passivation layer disposed on the low-K layer;
- an alignment pattern disposed in the passivation layer; and
- an open region in which the low-K layer and the passivation layer are partially removed,
- wherein the lower dummy pattern and the alignment pattern are spaced apart from one another in a lengthwise direction of the scribe lane.

19. The semiconductor chip of claim 18, wherein a shortest distance between the lower dummy pattern and the alignment pattern is not greater than 8 μm.

20. The semiconductor chip of claim 18, wherein a lower end of the alignment pattern is located at a higher level than a lower end of the lower.

\* \* \* \* \*